United States Patent
Narawade et al.

(10) Patent No.: US 11,025,237 B1
(45) Date of Patent: Jun. 1, 2021

(54) ZERO STATIC HIGH-SPEED, LOW POWER LEVEL SHIFTER

(71) Applicant: SiFive, Inc., San Mateo, CA (US)

(72) Inventors: Santosh Mahadeo Narawade, Bangalore (IN); Jithin K, Bangalore (IN); Mohit Gupta, San Jose, CA (US)

(73) Assignee: SiFive, Inc., San Mateo, CA (US)

( * ) Notice: Subject to any disclaimer, the term of this patent is extended or adjusted under 35 U.S.C. 154(b) by 0 days.

(21) Appl. No.: 16/827,985

(22) Filed: Mar. 24, 2020

(51) Int. Cl.
| | |
|---|---|
| *H03K 19/0175* | (2006.01) |
| *H03K 3/356* | (2006.01) |
| *H03K 19/0185* | (2006.01) |
| *H03K 19/003* | (2006.01) |
| *H03K 19/017* | (2006.01) |
| *H03K 19/00* | (2006.01) |

(52) U.S. Cl.
CPC .......... *H03K 3/356113* (2013.01); *H03K 19/0027* (2013.01); *H03K 19/00384* (2013.01); *H03K 19/017* (2013.01); *H03K 19/018521* (2013.01)

(58) Field of Classification Search
CPC ......... H03K 3/356113; H03K 19/0027; H03K 19/00384; H03K 19/017; H03K 19/018521
See application file for complete search history.

(56) References Cited

U.S. PATENT DOCUMENTS

| | | | |
|---|---|---|---|
| 5,528,173 A | 6/1996 | Merritt et al. | |
| 5,903,171 A * | 5/1999 | Shieh ..................... | G11C 7/065 327/55 |
| 6,963,226 B2 | 11/2005 | Chiang | |
| 7,663,423 B1 * | 2/2010 | Cheng .............. | H03K 3/356113 327/333 |
| 8,860,487 B2 * | 10/2014 | Ma ................... | H03K 3/356165 327/333 |
| 9,806,698 B1 * | 10/2017 | Mengad .......... | H03K 19/01852 |
| 2005/0134355 A1* | 6/2005 | Maede ............. | H03K 3/356113 327/333 |
| 2011/0001538 A1 | 1/2011 | Alam | |

* cited by examiner

*Primary Examiner* — Kurtis R Bahr
(74) *Attorney, Agent, or Firm* — Young Basile Hanlon & MacFarlane, P.C.

(57) ABSTRACT

Described is a high speed, low power level shifter circuit which includes a level shifter coupled to a sensing circuit. The level shifter includes a pair of source transistors, a pair of input transistors, and a pair of switching circuits connected between the source transistors and the input transistors. The sensing circuit turns off a switching circuit on an active side of the level shifter based on detecting that an output voltage of the level shifter has completed a voltage level transition from a first logic level voltage to a second logic level voltage. An open circuit is established on the active side and turns off the pair of source transistors. The other switching circuit is turned on. Static current flow on the active side of the level shifter is stopped and the output voltage is latched to a voltage representative of the second logic level voltage.

16 Claims, 5 Drawing Sheets

ZERO STATIC HIGH-SPEED, LOW POWER LEVEL SHIFTER

TECHNICAL FIELD

This disclosure relates to level shifters and in particular, high-speed, low power level shifters.

BACKGROUND

Input/output (I/O) circuits need to achieve I/O speeds from 1 Gbps to 50 Gbps at lower and lower fabrication sizes with increasingly lower supply voltages. Level shifters shift the voltage level of a logic signal from one operating voltage to another operating voltage and are used as front-end circuits for other circuits and devices such as I/O circuits, drivers, and the like. Conventional level shifters which attempt to operate at high-speed, do not operate with low power. A source of static current is always running and when multiplied by the number of level shifters needed in a device, such as a mobile phone for example, the total current drains battery power quickly.

Although level shifters are necessary for multi-voltage domain designs, existing architectures fail to address both high-speed and low power needs. If speeds are higher, power is higher. Existing architectures fail to address the low power aspect of high-speed designs and existing low power architectures fail to address high-speed usage due to its zero static current path fails used in high speed design. Level shifters remain power hungry blocks in conventional designs as there are multiple level shifters in the control, data, and clock paths since these paths remain in core register-transfer level (RTL) logic. This places a heavy burden on design power budgets. Available high-speed level shifter budgets fail to address low power. This creates a need to address both low power and high-speed level shifter designs which can be used in gigabit serializer/deserializer (serdes) applications where the constraint is to have low power designs along with high speed use.

Existing high-speed designs have larger glitch energies due to overlapped output and due to parasitic capacitance miller coupling capacitor at the output. The slew rates of existing architectures are limited due to the power budget and non-linear current graph at the output waveform. Power dissipation to minimize the load capacitance, direct current voltage, and the operating frequency is a solution for existing architectures. Charge sharing due to higher threshold switching of complementary metal-oxide-semiconductor (CMOS) logic puts restrictions on Fourier transform structure of the design. Existing architectures fail to provide higher signal power with respect to harmonics power due to glitches from parasitic coupled charge sharing. Traditional architectures remain active for 100% of the transition and thus take a larger power component. Existing low power level shifter designs fail to address 50% duty cycle needs of design. Jitter, duty cycle degradation, and skew margins are eaten up by existing level shifters.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
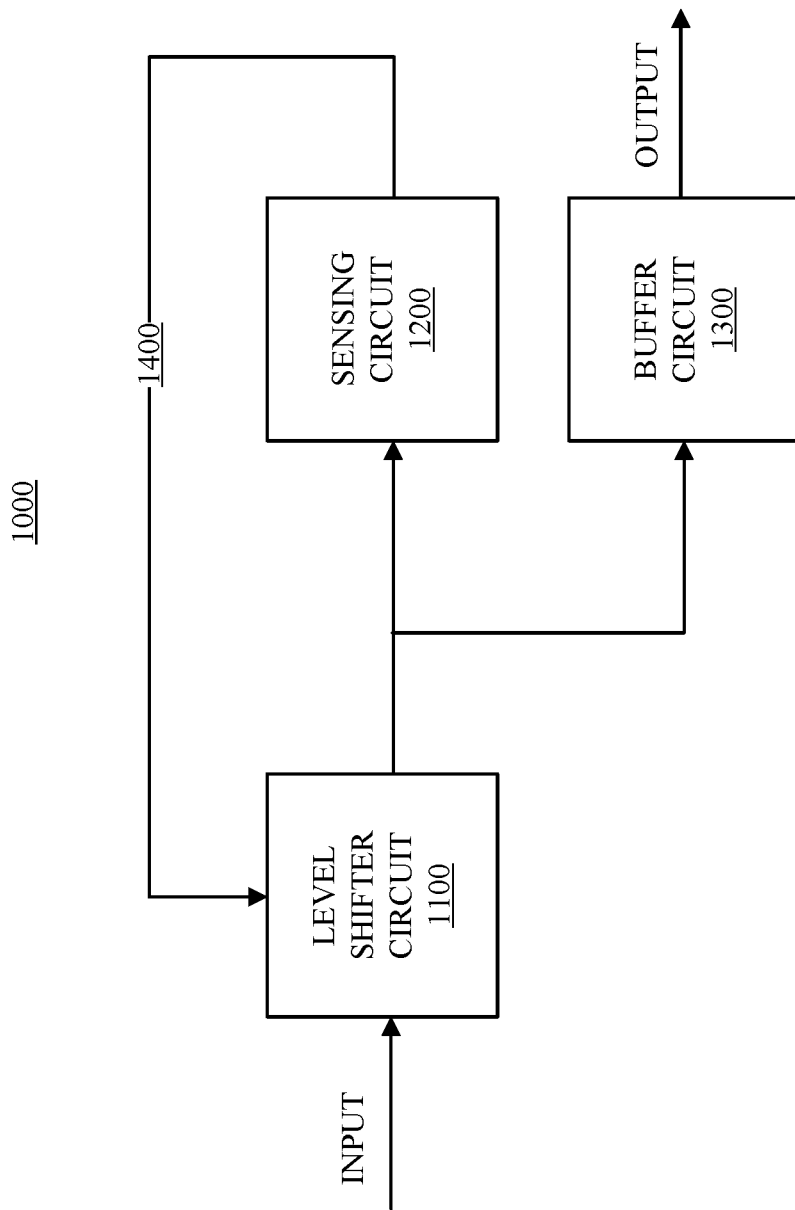
FIG. 1 is a block diagram of an example of a high-speed, low power level shifter circuit in accordance with embodiments of this disclosure.

Disclosed herein are circuits, systems and methods for a zero-static high-speed, low power level shifter. The zero-static high speed, low power level shifter circuit includes a level shifter coupled to a sensing circuit. The level shifter includes a pair of source transistors, a pair of input transistors, and a pair of switching circuits connected between the pair of source transistors and the pair of input transistors. The sensing circuit turns off a switching circuit on an active side of the level shifter based on detecting that an output voltage of the level shifter has completed a voltage level transition from a first logic level voltage to a second logic level voltage. Turning off the switching circuit establishes an open circuit on the active side and turns off the pair of source transistors. The other switching circuit is now turned on. Consequently, there is no static current on the active side of the level shifter and the output voltage is latched to a voltage representative of the second logic level voltage. In implementations, the sensing circuit waits a defined period prior to initiating closing of the switching circuit.

In implementations, the zero-static high speed, low power level shifter circuit permits high current during a voltage level transition period. Zero or substantially zero static current is achieved once transition is complete while maintaining intact transient graph of level shifter. Both low power and high speed is achieved due to accurate usage of the peak current requirement. The high speed, low power level shifter circuit decreases the glitch energy at the output to a low level due to diode latch activation near the voltage thresholds of p-type metal-oxide-semiconductor (PMOS) and n-type metal-oxide-semiconductor (NMOS) transistors. The high speed, low power level shifter circuit improves the spurious free dynamic range of the level shifter and the fundamental to harmonics signal power ratio. Slew rate is greatly improved and constant due to the constant current during transition and clamp outputs at the lower and higher ends. The high speed, low power level shifter circuit achieves lowest power during the transition as well due to the fact that active circuit is active only for approximately 70% of the transition and not required to be active for 100% of the transition as in conventional designs.

In implementations, an output transition control and sense circuit is implemented to track the input and output of the level shifter to turn off the active circuit after high or low transition is complete and to turn on a clamp circuit to latch the output. Switching or transition circuits are cutoff, which use significant power from the circuit in traditional approaches, and clamps the output to required output levels.

These and other aspects of the present disclosure are disclosed in the following detailed description, the appended claims, and the accompanying figures.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

The term "circuit" refers to an arrangement of electronic components (e.g., transistors, resistors, capacitors, and/or inductors) that is structured to implement one or more functions. For example, a circuit may include one or more transistors interconnected to form logic gates that collectively implement a logical function. For example, the processor can be a circuit. For example, the processor can be a circuit.

As used herein, the terminology "determine" and "identify," or any variations thereof, includes selecting, ascertaining, computing, looking up, receiving, determining, establishing, obtaining, or otherwise identifying or determining in any manner whatsoever using one or more of the devices and methods shown and described herein.

As used herein, the terminology "example," "embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is, unless specified otherwise, or clear from context, "X includes A or B" is intended to indicate any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

It is to be understood that the figures and descriptions of embodiments have been simplified to illustrate elements that are relevant for a clear understanding, while eliminating, for the purpose of clarity, many other elements found in typical processors. Those of ordinary skill in the art may recognize that other elements and/or steps are desirable and/or required in implementing the present disclosure. However, because such elements and steps do not facilitate a better understanding of the present disclosure, a discussion of such elements and steps is not provided herein.

Figure 5:
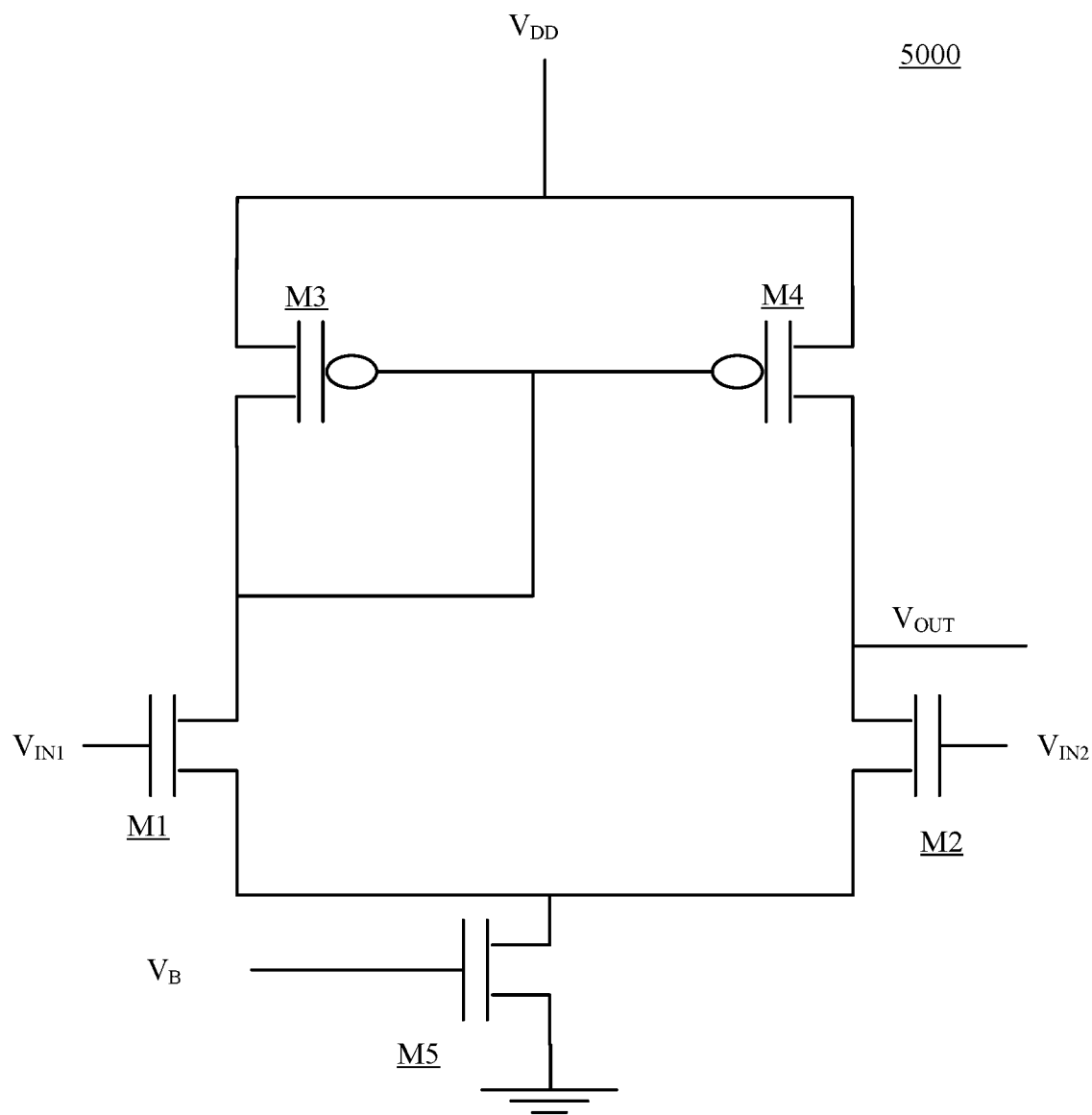
FIG. 5 is a block diagram of a level shifter circuit.

Conventional level shifters are power hungry devices as shown in FIG. 5, which is a block diagram of a conventional level shifter circuit 5000. The conventional level shifter circuit 5000 includes a pair of NMOS transistors M1 and M2 having sources tied to ground and a pair of PMOS transistors M3 and M4 having sources tied to supply voltage ($V_{DD}$). The drains of the NMOS transistor M1 and the PMOS transistor M3 are tied together and the drains of the NMOS transistor M2 and the PMOS transistor M4 are tied together. The gates of the pair of PMOS transistors M3 and M4 are tied together and are tied to the drain of the NMOS transistor M1. An output voltage ($V_{OUT}$) is tapped at a node between the NMOS transistor M2 and the PMOS transistor M4. A first input voltage ($V_{IN1}$) is tied to the gate of the NMOS transistor M1 and a second input voltage ($V_{IN2}$) is tied to the gate of the NMOS transistor M2. A NMOS transistor M5 enables operation of the conventional level shifter circuit 5000 via a bias input voltage (VB).

Operationally, if $V_{IN1}$ is 1 and $V_{IN2}$ is 0, then M1 is on and M2 is off. This results in M3 being on, which generates a bias voltage at the gate of M4, turning M4 on. This pulls $V_{OUT}$ to 1. In this instance, there will always be static current in the conventional level shifter circuit 5000 when $V_{IN1}$ is 1. As noted herein, high-speed operation requires higher current which in turn leads to higher static current. This leads to significant power drain as there are 1000s of level shifters in a system-on-a-chip (SoC), device, and the like.

FIG. 1 is a block diagram of an example of a high-speed, low power level shifter circuit 1000 in accordance with embodiments of this disclosure. In implementations, the high-speed, low power level shifter circuit 1000 includes a level shifter circuit 1100 which is connected to or in communication with (collectively "connected to") to a sensing circuit 1200 and a buffer circuit 1300. In implementations, the buffer circuit 1300 mitigates the impact of the output load on the sensing circuit 1200. In implementations, the level shifter circuit 1100 is a transistor circuit with a pair of switches connecting an input pair of transistors with a source pair of transistors. The sensing circuit 1200 is further connected to the level shifter circuit 1100 via a feedback loop 1400. The high-speed, low power level shifter circuit 1000 and each element or component in the high-speed, low power level shifter circuit 1000 is illustrative and can include additional, fewer or different devices, entities, element, components, and the like which can be similarly or differently architected without departing from the scope of the specification and claims herein. Moreover, the illustrated devices, entities, element, and components can perform other functions without departing from the scope of the specification and claims herein.

Operationally, the high-speed, low power level shifter circuit 1000 receives an input signal having a defined voltage level and outputs an output signal with a different defined voltage to other circuits, devices, or combinations thereof via the buffer circuit 1300. In implementations, the input signal is a high-speed input signal. In implementations, the input signal can have a speed in the range of 1 Gbps to 50 Gbps. The input signal can transition from a high logic signal to a low logic signal or from a low logic signal to a high logic signal. Accordingly, the output signal follows the logic level of the input signal.

The sensing circuit 1200 tracks the output signal as the input signal transitions from a first logic level to a second logic level. When the output signal reaches the second logic level, the sensing circuit 1200 causes an active switch from the pair of switches to turn off and the non-active switch to turn on. In implementations, the sensing circuit 1200 delays the deactivation of the active switch by a defined period. In implementations, the defined period is between 2-10 picoseconds. In implementations, the defined period is 5 picoseconds. The deactivation and activation of the pair of switches, respectively, creates an open circuit with respect to an active input transistor, provides no path for static current after the output signal logic level transition is complete, and clamps the output signal to the power supply voltage minus the threshold voltage associated with the source transistors. Consequently, high-speed operation is enabled with low power.

Figure 2:
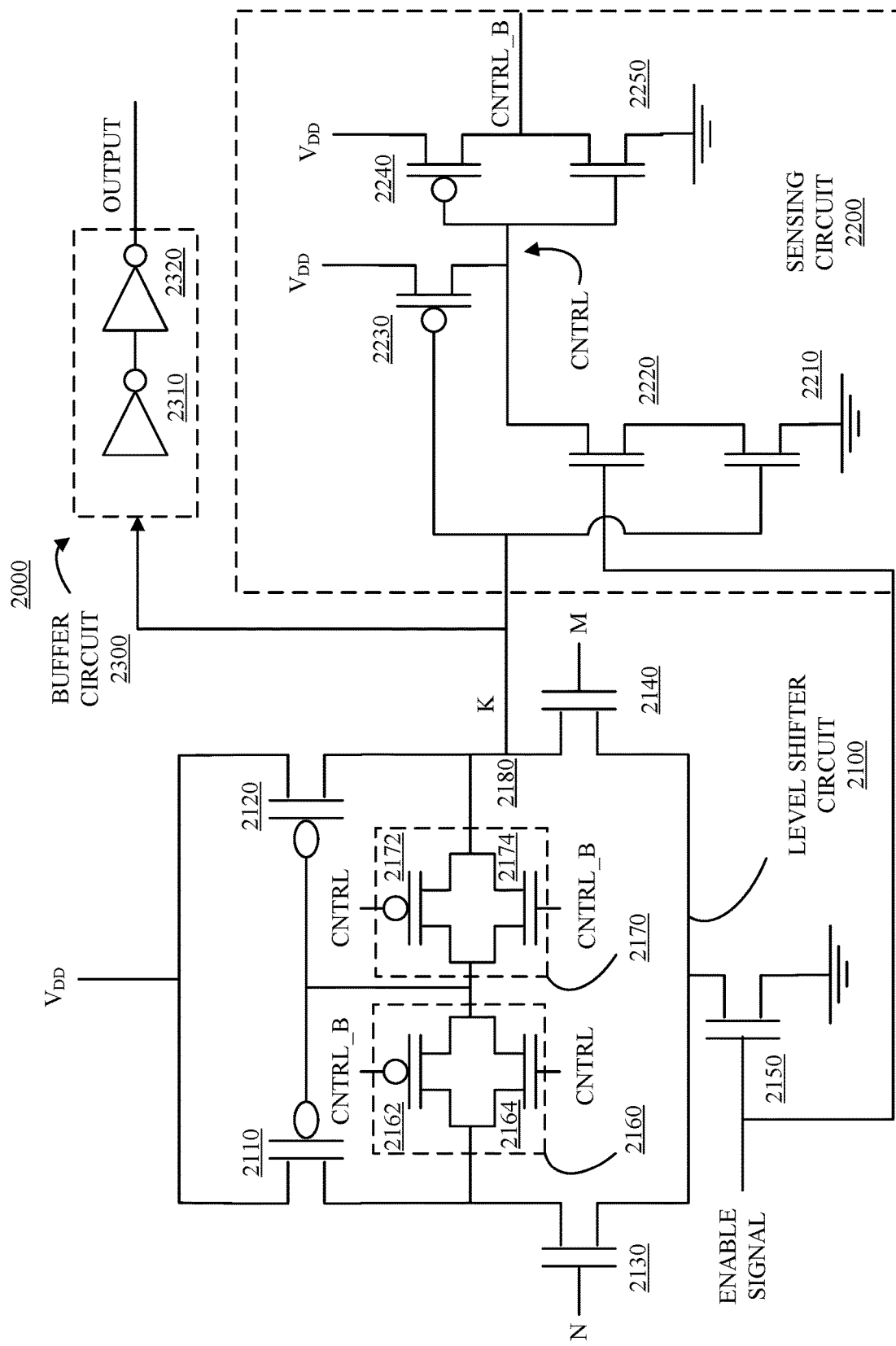
FIG. 2 is a block diagram of an example of a high-speed, low power level shifter circuit in accordance with embodiments of this disclosure.

FIG. 2 is a block diagram of an example of a high-speed, low power level shifter circuit 2000 in accordance with embodiments of this disclosure. The high-speed, low power level shifter circuit 2000 includes a level shifter circuit 2100 connected to a sensing circuit 2200, and a buffer circuit 2300. The high-speed, low power level shifter circuit 2000 and each element or component in the high-speed, low power level shifter circuit 2000 is illustrative and can include additional, fewer or different devices, entities, element, components, and the like which can be similarly or differently architected without departing from the scope of the specification and claims herein. Moreover, the illustrated devices, entities, element, and components can perform other functions without departing from the scope of the specification and claims herein.

The level shifter circuit 2100 includes a pair of source or load transistors 2110 and 2120 which each have sources tied to voltage supply ($V_{DD}$). In implementations, the pair of source or load transistors 2110 and 2120 are PMOS transistors. The level shifter circuit 2100 includes a pair of input transistors 2130 and 2140 which each have sources connected to ground and an enable signal via a transistor 2150. In implementations, the pair of input transistors 2130 and 2140 and the transistor 2150 are NMOS transistors. The high-speed, low power level shifter circuit 2000 is operational when the enable signal is enabled.

The level shifter circuit 2100 includes a pair of switching circuits 2160 and 2170. The switching circuit 2160 includes a PMOS transistor 2162 and a NMOS transistor 2164. The drains of the PMOS transistor 2162, the NMOS transistor 2164, the input transistor 2130, and the source transistor 2110 are tied together. The switching circuit 2170 includes a PMOS transistor 2172 and a NMOS transistor 2174. The drains of the PMOS transistor 2172, the NMOS transistor 2174, the input transistor 2140, and the source transistor 2120 are tied together. The sources of the PMOS transistor 2162, the NMOS transistor 2164, the PMOS transistor 2172, and the NMOS transistor 2174 are tied to the gates of the pair of source transistors 2110 and 2120.

The sensing circuit 2200 includes a NMOS transistor 2210, a NMOS transistor 2220, a PMOS transistor 2230, a PMOS transistor 2240, and a NMOS transistor 2250. The NMOS transistor 2210 has a gate tied an output node (K) 2180, a source tied to ground, and a drain tied to a source of the NMOS transistor 2220. A gate of the NMOS transistor 2220 is tied to the enable signal and a drain is tied to a drain of the PMOS transistor 2230, a gate of the PMOS transistor 2240, and a gate of the NMOS transistor 2250. A gate of the PMOS transistor 2230 is tied to the output node 2180 and a source is tied to $V_{DD}$. A source of the PMOS transistor 2240 is tied to $V_{DD}$ and a drain is tied to a drain of the NMOS transistor 2250, which has a source tied to ground. A control node (CNTRL) is tied to a gate of the PMOS transistor 2172 and a gate of the NMOS transistor 2164. A complementary control node (CNTRL_B) is tied to a gate of the PMOS transistor 2162 and a gate of the NMOS transistor 2174.

The buffer circuit 2300 includes a pair of serially connected inverters 2310 and 2320. The output node 2180 is connected to an input of the inverter 2310 and an output of the inverter 2320 is an output of the buffer circuit 2300.

Figure 3:
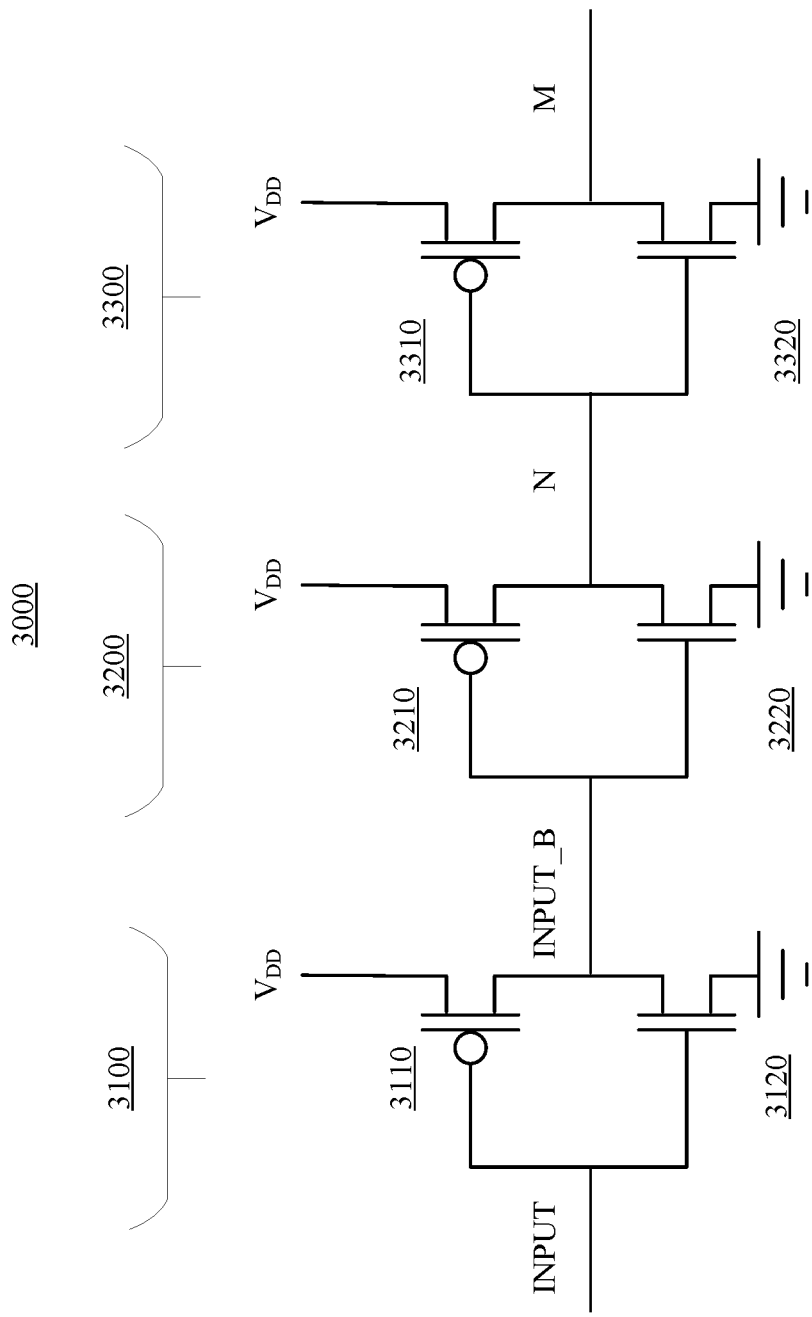
FIG. 3 is a block diagram of an example of an input generation circuit for the high-speed, low power level shifter circuits of FIG. 1 and FIG. 2 in accordance with embodiments of this disclosure.

FIG. 3 is a block diagram of an example of an input generation circuit 3000 for the high-speed, low power level shifter circuits of FIG. 1 and FIG. 2 in accordance with embodiments of this disclosure. The input generation circuit 3000 includes a first stage 3100 receiving an input (INPUT) and outputting a complementary input (INPUT_B). The first stage 3100 is connected to a second stage 3200. The INPUT is the input for the high-speed, low power level shifter circuit 2000, for example. The second stage 3200 receiving the INPUT_B and outputting a following input N. The second stage 3200 is connected to a third stage 3300. The third stage 3300 receiving the following input N and outputting a complementary input M. The following input N is connected to a gate of the input transistor 2130. The complementary input M is connected to a gate of the input transistor 2140.

The first stage 3100 includes a PMOS transistor 3110 having a source connected to $V_{DD}$ and a NMOS transistor 3120 having a source connected to ground. The gates of the PMOS transistor 3110 and the NMOS transistor 3120 tied to the INPUT. The drains of the PMOS transistor 3110 and the NMOS transistor 3120 are connected together and outputs the INPUT_B. The second stage 3200 includes a PMOS transistor 3210 having a source connected to $V_{DD}$ and a NMOS transistor 3220 having a source connected to ground. The gates of the PMOS transistor 3210 and the NMOS transistor 3220 tied to the INPUT_B. The drains of the PMOS transistor 3210 and the NMOS transistor 3220 are connected together and output the following input N. The third stage 3300 includes a PMOS transistor 3310 having a source connected to $V_{DD}$ and a NMOS transistor 3320 having a source connected to ground. The gates of the PMOS transistor 3310 and the NMOS transistor 3320 tied to the following input N. The drains of the PMOS transistor 3310 and the NMOS transistor 3320 are connected together and output the complementary input M.

In an illustrative example, assume that the following input N is 1 (the "active circuit or active side") and the complementary input M is 0 (the "non-active circuit or non-active side"). In this instance, K is 0 and is heading towards 1 since K follows the following input N in accordance with level shifter functionality. The switching circuit 2160 is on since K was initially 0 resulting in CNTRL being 1 (pulled high) and CNTRL_B being 0. This results in the pair of source transistors 2110 and 2120 being on, which causes K to be pulled to 0. As K meets or exceeds 1, and after a defined delay, the sensing circuit 2200 reverses the polarity of CNTRL and CNTRL_B so that CNTRL is 0 and CNTRL_B is 1. This results in the switching circuit 2160 being turned off and the switching circuit 2170 being turned on. This creates an open circuit on the active side and turns off the pair of source transistors 2110 and 2120. The output node 2180 or K is latched or clamped to the supply voltage minus a threshold voltage associated with the source transistor 2110. Accordingly, there is no static current or there is zero static current after the output node 2180 or K reaches 1 or completes the transition and the output node 2180 or K is at a value which follows the following input N logic level. The resulting high-speed, low power level shifter circuit 2000 maintains low power usage by not having static current beyond the transition period but achieves high-speed operability.

In the case where the following input N is 0 (the "non-active circuit or active side") and the complementary input M is 1 (the "active circuit or active side"), the operation is similar. In this instance, K is 1 and is heading towards 0 since K follows the following input N in accordance with level shifter functionality. The switching circuit 2170 is on since K was initially 1 resulting in CNTRL being 0 and CNTRL_B being 1. This results in the pair of source transistors 2110 and 2120 being on, which causes K to be pulled to 0. As K meets or exceeds 0, and after a defined delay, the sensing circuit 2200 reverses the polarity of CNTRL and CNTRL_B so that CNTRL is 1 and CNTRL_B is 0. This results in the switching circuit 2170 being turned off and the switching circuit 2160 being turned on. This creates an open circuit on the active side and turns off the pair of source transistors 2110 and 2120. The output node 2180 or K is latched or clamped accordingly. In implementations, K is clamped to the source-to-gate voltage ($V_{GS}$). Accordingly, there is no static current or there is zero static current after the output node 2180 or K reaches 0 or completes the transition and the output node 2180 or K is at a value which follows the following input N logic level. As before, the resulting high-speed, low power level shifter circuit 2000 maintains low power usage by not having static current beyond the transition period but achieves high-speed operability.

Figure 4:
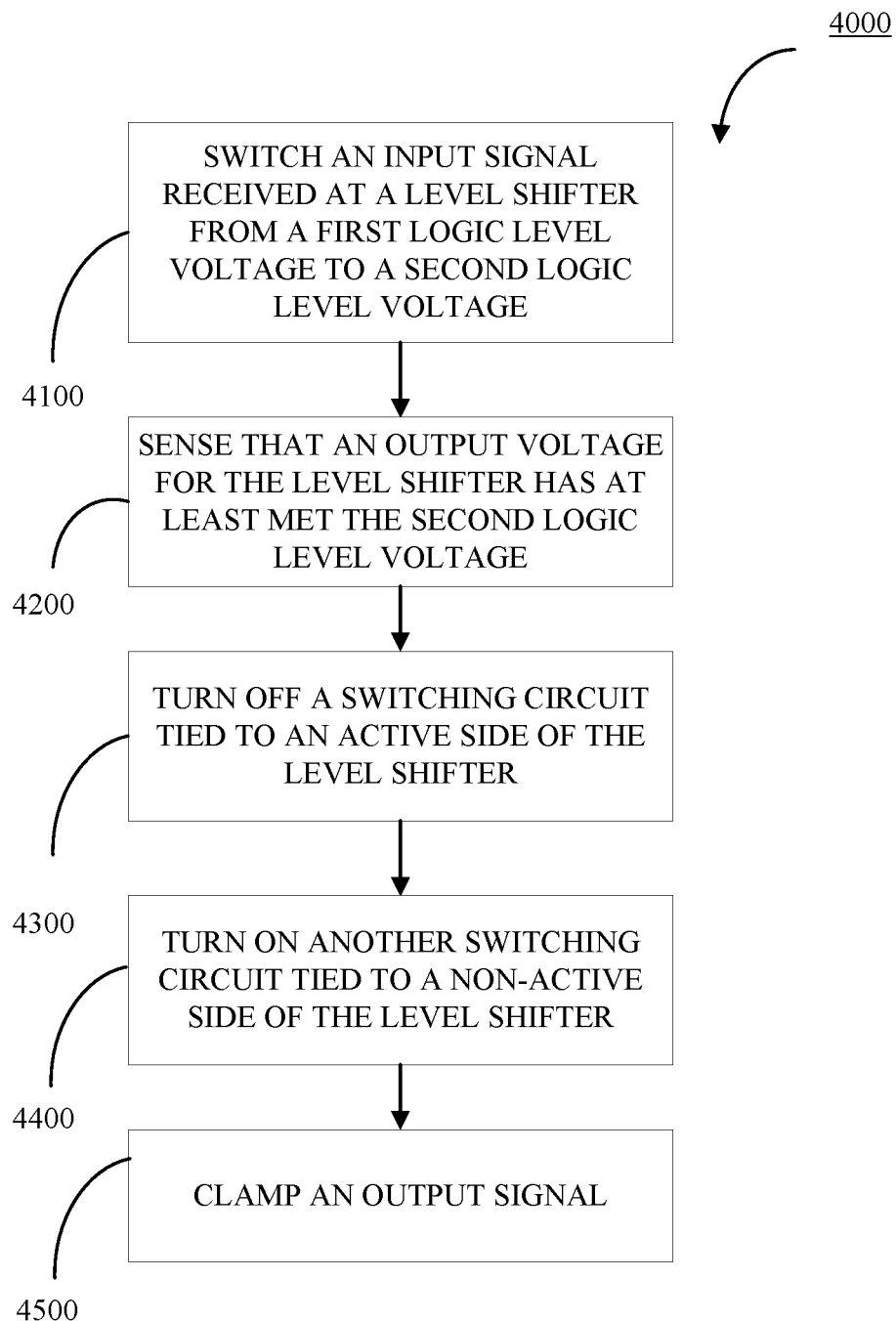
FIG. 4 is a diagram of an example technique for implementing high-speed, low power level shifting in accordance with embodiments of this disclosure.

FIG. 4 is a diagram of an example technique 4000 for implementing high-speed, low power level shifting in accordance with embodiments of this disclosure. The technique includes: switching 4100 an input signal received at a level shifter from a first logic level voltage to a second logic level voltage; sensing 4200 that an output voltage for the level shifter has at least met the second logic level voltage; turning 4300 off a switching circuit tied to an active side of the level shifter; turning 4400 on another switching circuit tied to a non-active side of the level shifter; and clamping 4500 an output signal. The technique 4000 can be implemented, for example, in the high-speed, low power level shifter circuit 1000 of FIG. 1, the high-speed, low power level shifter circuit 2000 of FIG. 2, and like circuits, devices and systems.

The technique 4000 includes switching 4100 an input signal received at a level shifter from a first logic level voltage to a second logic level voltage. A level shifter includes a pair of input transistors and a pair of source transistors which are connected via a pair of switching circuits. One of the switching circuits is on and one of the switching circuits is off.

The technique 4000 includes sensing 4200 that an output voltage for the level shifter has at least met the second logic level voltage. The determination of which one of the switching circuits is on and which one of the switching circuits is off is based on control signals generated by a sensing circuit that tracks an output voltage. When the sensing circuit senses that the output voltage has reached the second logic level voltage, the polarity of the control signals is reversed.

The technique 4000 includes turning 4300 off a switching circuit tied to an active side of the level shifter. The reversal of the control signals causes the currently on or active switching to be turned off. This results in an open circuit on the active side of the level shifter and turns off the pair of source transistors.

The technique 4000 includes turning 4400 on another switching circuit tied to a non-active side of the level shifter. The reversal of the control signals causes the currently off or non-active switching to be turned on. The output voltage is then pulled toward the second logic level voltage.

The technique 4000 includes clamping 4500 an output signal. The output voltage is clamped at a voltage value representative of the second logic level voltage. For example, the output voltage is clamped at Vdd-Vth when the output voltage transitions from low (0) to high (1), and is clamped at Vsg when the output voltage transitions from high (1) to low (0).

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more computer readable mediums having computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A zero-static high-speed, low power level shifter circuit comprising:
    a level shifter circuit including a pair of input transistors, a pair of source transistors, and a pair of switching circuits connecting the pair of input transistors and the pair of source transistors, wherein one switching circuit of the pair of switching circuits is configured to be an active switching circuit and another switching circuit of the pair of switching circuits is configured to be a non-active switching circuit, wherein the pair of switching circuits includes a first switching circuit having a n-type metal-oxide-semiconductor (NMOS) transistor and a p-type metal-oxide-semiconductor (PMOS) transistor, and a second switching circuit having a NMOS transistor and a PMOS transistor; and
    a sensing circuit connected to the level shifter circuit, the sensing circuit configured to:
        sense whether an output signal of the level shifter circuit at least meets a voltage representative of a switched to logic level voltage; and
        generate control signals for turning off a configured active switching circuit and turning on a configured non-active switching circuit when the output signal of the level shifter circuit meets the voltage representative of the switched to logic level voltage,
    wherein, for the first switching circuit, the NMOS transistor is connected to one of the control signals and a PMOS transistor is connected to a complementary one of the control signals, and for the second switching circuit, the NMOS transistor is connected to the complementary one of the control signals; and the PMOS transistor is connected to the one of the control signals, and
    wherein when the pair of source transistors are off, static current flow is prevented and the output voltage is clamped to the voltage representative of the switched to logic level voltage.

2. The zero-static high-speed, low power level shifter circuit of claim 1, wherein each of the pair of input transistors is a n-type metal-oxide-semiconductor (NMOS) transistor.

3. The zero-static high-speed, low power level shifter circuit of claim 2, wherein each of the pair of source transistors is a p-type metal-oxide-semiconductor (PMOS) transistor.

4. The zero-static high-speed, low power level shifter circuit of claim 1, further comprises:
    a buffer circuit connected to the output of the level shifter circuit.

5. The zero-static high-speed, low power level shifter circuit of claim 1, wherein the voltage representative of the switched to logic level voltage is a supply voltage minus a transistor threshold voltage when the switched to logic level voltage is high.

6. The zero-static high-speed, low power level shifter circuit of claim 5, wherein the voltage representative of the switched to logic level voltage is a source-to-gate voltage of a transistor when the switched to logic level voltage is low.

7. A method comprising:
    switching an input signal received at a level shifter from a first logic level voltage to a second logic level voltage;
    sensing that an output voltage for the level shifter has at least met a voltage level representative of the second logic level voltage;
    turning off a pair of source transistors in the level shifter after sensing that the output voltage for the level shifter has at least met the voltage level representative of the second logic level voltage;
    turning off a switching circuit connected to an active side of the level shifter;

turning on another switching circuit connected to a non-active side of the level shifter; and clamping an output signal to the voltage level representative of the second logic level voltage.

8. The method of claim 7, further comprises:
generating a set of control signals to turn off the switching circuit connected to the active side of the level shifter.

9. The method of claim 8, further comprises:
generating a complementary set of control signals to turn on the another switching circuit connected to the non-active side of the level shifter.

10. The method of claim 7, further comprises:
buffering the output signal to mitigate device loading.

11. A device comprising:
a level shifter including a pair of switches, each switch configurable between an active mode and a non-active mode; and
a sensor connected to the level shifter, the sensor configured to:
track a level shifter output as level shifter output transitions from a first voltage level to a second voltage level; and
generate control signals for turning off a switch in the active mode and turning on a switch in a non-active mode when transition is complete, enabling zero-static current flow in the level shifter,
wherein one of the pair of switches includes a n-type metal-oxide-semiconductor (NMOS) transistor connected to one of the control signal and a p-type metal-oxide-semiconductor (PMOS) transistor connected to a complementary one of the control signals, and another of the pair of switches includes a NMOS transistor connected to the complementary one of the control signals, and a PMOS transistor connected to the one of the control signals.

12. The device of claim 11 further comprises:
a pair of input transistors; and
a pair of source transistors connected via the pair of switches,
wherein the pair of source transistors is off when transition is complete.

13. The device of claim 12, wherein each of the pair of input transistors is a n-type metal-oxide-semiconductor (NMOS) transistor.

14. The device of claim 13, wherein each of the pair of source transistors is a p-type metal-oxide-semiconductor (PMOS) transistor.

15. The device of claim 11, wherein the level shifter output is clamped to a source-to-gate voltage of a transistor when the second voltage level is low.

16. The device of claim 15, wherein the level shifter output is clamped to a supply voltage minus a transistor threshold voltage when the second voltage level is high.

* * * * *